United States Patent [19]

Ziger

[11] Patent Number: 5,126,289
[45] Date of Patent: Jun. 30, 1992

[54] SEMICONDUCTOR LITHOGRAPHY METHODS USING AN ARC OF ORGANIC MATERIAL

[75] Inventor: David H. Ziger, San Antonio, Tex.

[73] Assignee: AT&T Bell Laboratories, Murray Hill, N.J.

[21] Appl. No.: 555,217

[22] Filed: Jul. 20, 1990

[51] Int. Cl.⁵ .................. H01L 21/469; H01L 21/312
[52] U.S. Cl. .................................. 437/231; 437/229; 437/978; 430/318
[58] Field of Search .............. 437/229, 231, 978; 430/317, 318, 271; 148/DIG. 51; 156/643

[56] References Cited

U.S. PATENT DOCUMENTS

| | | | |
|---|---|---|---|
| 4,196,246 | 4/1980 | Takayama et al. | 428/213 |
| 4,380,488 | 4/1983 | Reichelderfer et al. | 156/643 |
| 4,444,618 | 4/1984 | Saia et al. | 156/643 |
| 4,554,229 | 11/1985 | Small, Jr. | 430/17 |
| 4,557,797 | 12/1985 | Fuller et al. | 437/229 |
| 4,601,972 | 7/1986 | Small, Jr. | 430/280 |
| 4,668,606 | 5/1987 | DoMinh et al. | 430/271 |
| 4,719,146 | 1/1988 | Hohage et al. | 428/331 |
| 4,820,611 | 4/1989 | Arnold, III et al. | 437/229 |
| 4,910,122 | 3/1990 | Arnold et al. | 430/318 |
| 4,985,112 | 1/1991 | Egitto et al. | 156/643 |

FOREIGN PATENT DOCUMENTS 0194621 8/1987 Japan.

OTHER PUBLICATIONS

Wolf et al., "Silicon Processing for the VLSI Era", pp. 545-546, pp. 559-565, 1986.
Wolters, R. A. M., "Selectivity Aspects in Aluminum Plasma Etching", Chemical Abstracts, vol. 97, No. 16—137162b, Apr. 1987.

Primary Examiner—Brian E. Hearn
Assistant Examiner—C. Chaudhari
Attorney, Agent, or Firm—R. B. Anderson

[57] ABSTRACT

An antireflection coating (16) for use with a photolithographic process comprises a layer of organic material that planarizes the surface upon which a photoresist layer (21) is deposited, is highly absorptive of deep ultraviolet actinic light, and can be plasma etched along with an underlying metal layer (11), thereby obviating the need for a separate step to remove the exposed antireflection coating prior to metal etch.

3 Claims, 2 Drawing Sheets

//5,126,289//

SEMICONDUCTOR LITHOGRAPHY METHODS USING AN ARC OF ORGANIC MATERIAL

TECHNICAL FIELD

This invention relates to semiconductor photolithography methods and, more particularly, to such methods using deep ultraviolet actinic light for defining features of one micron or less.

BACKGROUND OF THE INVENTION

One step in the fabrication of semiconductor devices such as integrated circuits is the formation of a conductor pattern over a semiconductor substrate through photolithographic masking and etching. A photoresist coating over a metal layer is selectively exposed to actinic light directed through a mask defining the desired conductor pattern. After photoresist development, the photoresist layer constitutes a mask having openings defining the desired conductor pattern which are used to permit selective etching of the exposed portions of the metal layer to leave the desired conductor pattern overlying the substrate. The etching is often done in a plasma etch reactor in which a plasma of ions reacts with and etches away the exposed metal portions.

Trends toward increased circuit density require a shorter wavelength of the actinic light used for exposing the photoresist, a higher degree of control of surface geometry, and substantial elimination of spurious reflections of the actinic light. It has been recognized that a separate antireflection coating should often be included between the metal film and the photoresist film to prevent exposure of photoresist by reflected components. Deep ultraviolet light is of a sufficiently short wavelength to permit definition within submicron tolerances. However, most substrates are more highly reflective of deep ultraviolet light than longer wavelengths, thereby increasing the need for an effective antireflection coating.

The fabrication of semiconductor devices is extremely competitive and it is well recognized in the industry that any methods that reduce the number of fabrication steps required will be of significant value. It is further recognized that any methods that increase the reproducibility with which patterns can be made with submicron tolerances are important. These considerations are subjects of extensive continuing research and development work within the industry.

SUMMARY OF THE INVENTION

The invention uses as an antireflection coating for a photolithographic process a layer of organic material that planarizes the surface upon which the photoresist layer is to be deposited, is highly absorptive of deep ultraviolet actinic light, and can be plasma etched along with an underlying metal layer, thereby obviating the need for a separate step to remove the exposed antireflection coating prior to metal etch. To give planarization, the organic material is initially a fluid which is deposited and spun onto the substrate surface such that, after spinning, it settles to a thickness greater than the height of any non-uniformity on the substrate surface. Thereafter, the antireflection coating hardens to provide a planar top surface for conventional coating by spinning of the photoresist material. The photoresist layer is therefore planarized and is made to have a uniform thickness as required for high definition deep ultraviolet lithography.

The fluid deposited as the antireflection coating may be a polymer precursor which hardens to form a polymer layer, or it may be a polymer dissolved in a liquid carrier which is hardened through evaporation of the liquid carrier. Several examples of appropriate materials will be given which can be plasma etched simultaneously with an underlaying metal layer. This method may also be useful for controlling the plasma etch of an underlying non-metal layer such as silicon oxide.

These and other objects, features and advantages of the invention will be better understood from a consideration of the following detailed description taken in conjunction with the accompanying drawing.

DETAILED DESCRIPTION

Figure 1:
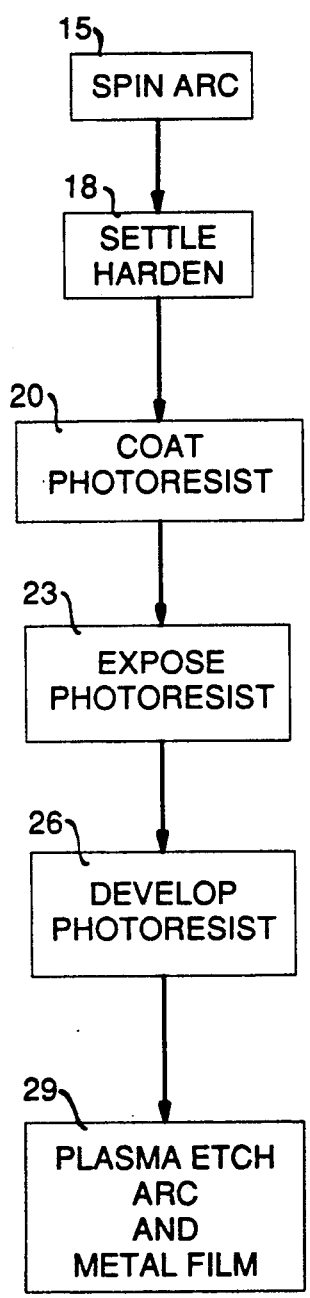
FIG. 1 is a flow diagram of a method for photolithographically masking and etching semiconductor devices such as integrated circuits in accordance with an illustrative embodiment of the invention.
Figure 2:
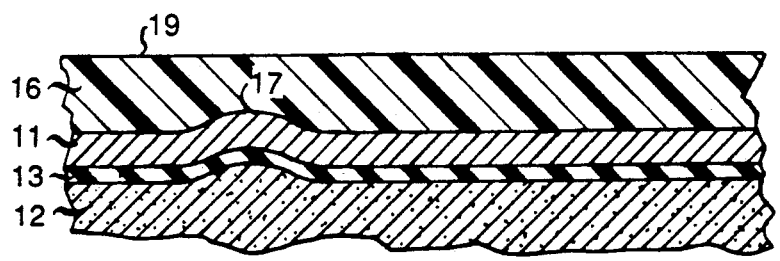
FIGS. 2-5 illustrate a coated semiconductor substrate at various stages of the method depicted in FIG. 5.

Referring to FIG. 1, there is shown a flow chart depicting successive steps in the photolithographic masking and etching of a layer such as a metal layer overlying a semiconductor substrate. Referring to FIG. 2, the method is intended to create a conductor pattern in a conductive film 11 which overlies a semiconductor substrate 12 and is typically insulated from the substrate by a dielectric layer 13 of a material such as silicon dioxide. Referring again to FIG. 1, the first step 15 of the method is to spin an antireflection coating (ARC) on the upper surface of the metal film 11; that is, to deposit a fluid antireflection coating on a surface and then distribute it by spinning the substrate, in a manner well known in the art. Referring to FIG. 2, the fluid antireflection coating 16 that is spread over the surface of the metal layer 11 is of sufficient viscosity and sufficient thickness to be at least thicker, and preferably three times as thick as, the height of the most prominent surface irregularity on the surface of the metal film 11. As will be discussed more fully below, a polymer precursor or a polymer dissolved in a liquid carrier can be devised to meet the these requirements. A surface irregularity 17 may occur due to an irregularity on the surface of the semiconductor substrate 12 with the layers 13 and 11 conforming to that irregularity so that it is manifested on the upper surface of metal layer 11 as illustrated at 17.

As shown in FIG. 1, the second step 18 is to permit the fluid antireflection coating to settle and harden. If a polymer precursor is used, the hardening is the stop of polymerization, and if the fluid 16 is a polymer in a carrier, the hardening results from the evaporation of the carrier. Referring again to FIG. 2, this step results in a planarized upper surface 19 of the coating 16.

Figure 3:

Referring again to FIG. 1, the next step 20 is to coat the upper surface 19 with a layer of photoresist. The photoresist is deposited and distributed, again, by spinning, as is well known in the art which results in a photoresist layer 21 shown in FIG. 3. Because of the planarization of the upper surface 19 of antireflection coating 16, the photoresist layer 21 can be made to have a highly uniform thickness and a highly planar upper surface which are desired for accurate selective exposure by deep ultraviolet light, that is, light having a very short wavelength.

Figure 4:
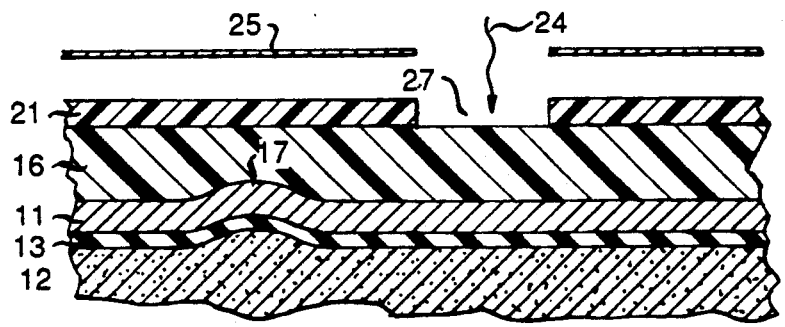

The next step 23 of FIG. 1 is to expose selectively the photoresist to deep ultraviolet light. As shown in FIG. 4, the photoresist coating 21 is exposed to ultraviolet light 24 transmitted through an opening in a mask 25. As is known in the art, development of the photoresist coating produces openings 27 in the photoresist coating describing the desired pattern to be formed in the metal layer 11.

In accordance with the invention, the antireflection coating and the metal film are simultaneously plasma etched as indicated by step 29 of FIG. 1. Plasmas of halogen compounds are typically used to anisotropically etch metals such as aluminum. Plasma etching requires that the substrate be placed in a reactor in which a plasma is formed by electrically ionizing a reactive gas such as gaseous $CF_4$ or $CCl_4$. The reactor may be a reactor such as that available from the Applied Materials Corporation of Santa Clara, Calif., known as the Model 5000 reactor.

Figure 5:
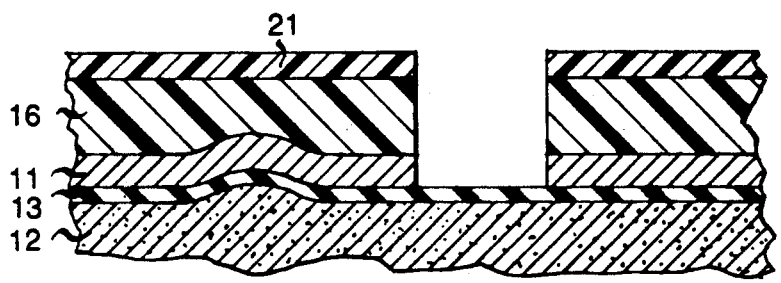

Referring to FIG. 5, the antireflection coating 16 is reactive with the halogen plasma and so it etches along with the aluminum conductor 11. The patterned photoresist 21 is not etched by the plasma and therefore constitutes a mask for defining the etched pattern in both the antireflection coating and the metal layer 11. After the plasma etch, the photoresist layer 21 and the antireflection coating 16 may be removed by etching, as is known, so as to leave the patterned conductive metal film 11.

In one successful embodiment of the method, polybutylsulfone dissolved in chlorobenzene was used as the antireflection coating. Such coating may contain a dye or ultraviolet absorbing material such as bis-(4-azidophenyl)ether, which has a strong absorption in the two hundred fifty to two hundred eighty nanometer range. Deep ultraviolet light in general can be considered as light having wavelengths of less than about three hundred nanometers. The actinic wavelength used of course corresponds to the absorption band of the ARC.

A potentially more useful embodiment would be to use as the fluid antireflection coating a liquid precursor of a polysulfone or a polyaldehyde. The hardening of step 20 of FIG. 2 would then occur by polymerizing the precursor. These materials are known to have a low resistance to a halogen plasma etch, and they can be thermally or photochemically polymerized. Another ARC resin that could be used would be poly(methyl)-pentenesulfone. This is chemically similar to polybutylsulfone and should be unstable in the plasma environment as is required for plasma etching.

Although particularly useful in the lithography of aluminum conductor films, the invention could be used for patterning non-metal films such as silicon dioxide; plasmas can be formed for etching silicon dioxide. The antireflection coating should of course be absorptive of the actinic light, and various additives other than those specifically mentioned may be devised for accomplishing this, or if the material is intrisically sufficiently absorptive, no additive may be required. Various other modifications and embodiments can be made by those skilled in the art without departing from the spirit and scope of the invention.

I claim:

1. A method for making semiconductor devices comprising the steps of:

making a first aluminum layer on a surface of a substrate having an upper surface containing surface irregularities;

coating the first layer with an antireflection coating having a thickness greater than the heights of the surface irregularities;

coating the antireflection coating with a photoresist coating;

exposing the photoresist coating to deep ultraviolet actinic light which is not efficiently reflected by the antireflection coating;

developing the photoresist to define therein a pattern;

and using the pattern to define portions of semiconductor devices; characterized in that:

the antireflection coating comprises a dye that is absorptive of deep ultraviolet light and a precursor of a polymer selected from the group consisting of polysulfone and polyaldehyde that is coated on a substrate by depositing it in a fluid form on the substrate, spinning the substrate to distribute the organic material, then polymerizing the precursor such that it has an upper surface substantially free of surface irregularities prior to coating with the photoresist layer;

the hardened antireflection coating is absorptive of the deep ultraviolet actinic light and is amenable to plasma etching;

and the first layer and the antireflection coating are simultaneously plasma etched at regions exposed by the pattern of the photoresist layer to substantially completely remove such regions of the first layer and the antireflection coating exposed by the pattern;

the simultaneous plasma etching step comprises the step of plasma etching is an atmosphere containing an active species of $CCl_4$.

2. The method of claim 1 further characterized in that: the polymer precursor is a precursor of polysulfone.

3. The method of claim 1 further characterized in that: the polymer precursor is a precursor of polyaldehyde.

* * * * *